(12) United States Patent
Barwin et al.

(10) Patent No.: US 7,403,061 B2
(45) Date of Patent: Jul. 22, 2008

(54) METHOD OF IMPROVING FUSE STATE DETECTION AND YIELD IN SEMICONDUCTOR APPLICATIONS

(75) Inventors: John E. Barwin, Essex Junction, VT (US); Steven H. Lamphier, Colchester, VT (US); Harold Pilo, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 11/277,315

(22) Filed: Mar. 23, 2006

(65) Prior Publication Data

US 2007/0222497 A1 Sep. 27, 2007

(51) Int. Cl.
*H01H 37/76* (2006.01)
(52) U.S. Cl. ............... 327/525; 327/526; 365/225.7
(58) Field of Classification Search ........... 327/525, 327/526; 365/225.7
See application file for complete search history.

(56) References Cited

U.S. PATENT DOCUMENTS

| 5,418,487 | A |   | 5/1995 | Armstrong, II |
| 5,748,031 | A | * | 5/1998 | Best ........................... 327/525 |
| 6,426,668 | B1 |   | 7/2002 | Morrish et al. |
| 6,498,526 | B2 |   | 12/2002 | Lim et al. |
| 6,906,557 | B1 |   | 6/2005 | Parker et al. |
| 6,919,754 | B2 |   | 7/2005 | Kuroki |
| 6,995,601 | B2 | * | 2/2006 | Huang et al. ................ 327/525 |
| 7,215,175 | B1 | * | 5/2007 | Mandal et al. .............. 327/525 |
| 7,221,210 | B2 | * | 5/2007 | Parker et al. ................ 327/525 |

* cited by examiner

*Primary Examiner*—Kenneth B. Wells
(74) *Attorney, Agent, or Firm*—Gibb & Rahman, LLC; Michael LeStrange, Esq.

(57) ABSTRACT

Disclosed are embodiments of an apparatus incorporating a detection circuit adapted for determining the state of selected fuses and a programming circuit for blowing selected fuses on demand. Also, disclosed are embodiments of an associated method. The detection circuit comprises a plurality of fuses in identical signal and reference legs in order to increase the signal margin for detecting blown fuses and/or current sources configured to pass offset currents through the signal and reference legs in order to set the trip point for detecting blown fuses between the un-blown and the minimum blown resistances. Thus, the invention provides the flexibility of single-sided fuse state detection devices with even greater sensitivity than both single-sided and differential fuse state detection device.

16 Claims, 6 Drawing Sheets

US 7,403,061 B2

METHOD OF IMPROVING FUSE STATE DETECTION AND YIELD IN SEMICONDUCTOR APPLICATIONS

BACKGROUND

1. Field of the Invention

The embodiments of the invention generally relate to fuse state detection, and particularly, to a circuit for detecting whether or not a fuse is blown.

2. Description of the Related Art

Recently, simple electrical fuses that can be blown on demand have been designed into chips to alter chip performance after fabrication. For example, fuses within chips can be used to help repair flaws, to manage power consumption or to control individual circuit speed. Similarly, fuses within chips can be blown in order to optimize or tailor chip performance and capability based on customer demands. These fuses are typically thin strips of conductive material (e.g., semiconductor or metal) that are incorporated into a conductive path within a circuit. Such fuses can be blown (i.e., made less conductive) by forcing an excessive current therethrough.

Chips that are designed with these fuses are also designed with fuse state detections circuits (i.e., fuse sense circuits) for determining whether or not individual fuses have been blown. Various techniques for detecting fuse states are known, as illustrated in U.S. Patent Application Publication No. US2005/0151578 of Huang et al., published on Jul. 14, 2005 and incorporated herein by reference. These techniques generally detect the change in the resistance of the fuse device from a low value to a high value. For example, one type of fuse state detection circuit (i.e., a single-sided fuse state detection circuit) compares the voltage of a current that has passed through the fuse to a reference voltage. Another type of fuse state detection circuit (i.e., a differential fuse state detection circuit) compares the voltage of a current that has passed through the fuse with the voltage of current that has passed through an identical reference fuse. Such known fuse detections circuits offer advantages and disadvantages that are related to both flexibility and sensitivity. These advantages and disadvantages must be balanced when determining which fuse detection circuit to use. Therefore, there is a need in the art for an improved fuse detection circuit that provides the same or greater advantages with regard to flexibility and sensitivity as both single-sided fuse detection circuits and differential fuse detection circuits.

SUMMARY

In view of the foregoing, disclosed herein are embodiments of an apparatus that incorporates both a fuse state detection circuit adapted to determine the state of selected fuses, as blown or un-blown, and a fuse programming circuit adapted to blow selected fuses within the apparatus on demand. Also disclosed herein are embodiments of an associated method of detecting the state of selected fuses within such an apparatus.

The fuse state detection circuit can comprise two current sources, a voltage difference detection device with two inputs and identical signal and reference legs. The signal and reference legs of the circuit are each electrically connected between a corresponding one of the current sources and a corresponding one of the inputs to the voltage difference detection device. A plurality of identical fuses can be connected in series within each leg to increase the sensitivity of the circuit by increasing the raw signal that can be detected by the voltage difference detection device. Additionally, the current sources that are incorporated into the fuse state detection circuit can be configured so that the current passing to each leg is offset. By providing offset currents to each leg, the trip point is selectively placed somewhere between the un-blown resistance and the minimum blown resistance. Consequently, the voltage difference detection device can default to a known state (blown) and the fuses in the signal leg do not have to be blown prior to testing allowing for greater flexibility.

More specifically, the current sources of the fuse state detection circuit can comprise a first current source adapted to produce a first current and a second current source adapted to produce a second current. The first and second current sources can be configured so that the first and second currents are offset (i.e., first current<second current), reducing distributed mismatch. For example, different controlled gate voltages can be applied to identical p-type field effect transistors (p-FETs) connected to the signal and reference legs of the circuit to produce the offset currents. However, using locally offset currents allows for even closer matching. Thus, for example, the first current source can comprise a first transistor (e.g., a first p-FET) connected to the signal leg. The second current source can similarly comprise a second transistor (e.g., a second p-FET) connected to the reference leg. To offset the first and second currents, the first and second p-FETs can be formed with different gate widths. Alternatively, the first current source can comprise a first group of p-FETs electrically connected in parallel to the signal leg. The second current source can similarly comprise a second group of p-FETs electrically connected in parallel to the reference leg. Each of theses p-FETs can be digitally selectable. Thus, an equal current can be applied to both the first and second groups of p-FETs, however, by digitally selecting individual p-FETs within each group, the size of the first and second currents can be offset.

The identical signal and reference legs of the fuse detection circuit can each comprise a plurality of identical fuses electrically connected in series between a current source and an input to the voltage difference detection device. Specifically, the signal leg can comprise a plurality of first fuses electrically connected in series between the first current source and the first input to the voltage difference detection device so that the first current flows from the first current source through the first fuses to the first input. The reference leg can similarly comprise a plurality of second fuses electrically connected in series between the second current source and the second input to the voltage difference detection device so that the second current flows from the second current source through the second fuses to the second input.

The voltage difference detection device can be adapted to sense a first voltage of the first current at the first input (i.e., after the first current has passed through the first fuses) and a second voltage of the second current at the second input (i.e., after the second current has passed through the second fuses). The voltage difference detection device can further be adapted to determine a difference between the first voltage and the second voltage, which when evaluated (e.g., by a processor) can be used to determine the state of the fuses within the signal leg. It should be noted that during a fuse state detection process, the fuses within the reference leg would remain un-blown.

The fuse programming circuit of the apparatus can comprise a blow voltage, a primary blow decode transistor, a controller, and a plurality of secondary blow transistors. The blow voltage is a supply voltage or voltage source that is sufficient to cause a current within the programming circuit passing over the first fuses to become high enough to blow the first fuses (i.e., blow current). This blow voltage is higher than the supply voltage required for normal chip operation. The primary blow decode transistor (e.g., a p-FET) and the secondary blow transistors (e.g., n-FETs) in combination control flow of the blow current through the fuses and, thus, control blowing of the first fuses. Specifically, each fuse is electrically connected between the primary blow decode transistor and a corresponding secondary blow transistor. A controller (i.e., a blow decode device) is used to initiate on demand sequential blowing of the first fuses by turning on the primary blow decode transistor, allowing the blow current to flow through the circuit. Each of the secondary blow transistors (e.g., n-FETs) control the flow of this blow current through the corresponding first fuses and also function as n-FET clamps to ground in order to avoid shorts to ground.

Additionally, these secondary transistors can be configured so that their gate voltage is approximately equal to the blow voltage and so that they are remotely controlled. By increasing the potential on the gates of the secondary transistors above the normal chip operating voltage and by controlling these transistors remotely, their size can be minimized.

As mentioned above, the voltage difference detection device compares the first voltage of the first current at the first input to the second voltage of the second current at the second input. A detectable difference between these voltages represents a difference in resistance that is the result of blown fuses. Specifically, if fuses in the signal leg are blown and the fuses in the reference leg remained intact, then the resistance of the signal leg will be greater than that of the reference leg and this greater resistance will be evidenced by a detectable difference between the first and second voltages. Therefore, the first and second voltages are compared to make a determination as to whether or not the fuses in the signal leg have been blown. Because the first current is passed through, not one, but a plurality of first fuses in the signal leg and the second current is passed through, not one, but a plurality of second fuses in the reference leg, the potential difference between the signal leg resistance and the reference leg resistance is significantly increased. Thus, the detectable range for blown fuses is increased proportionate to the number of additional fuses, thereby providing an even greater detect sensitivity than that seen with both prior art single-side and differential fuse state detection techniques. Additionally, because the current that is passed through the signal leg is selectively smaller than the current that is passed through the reference leg, the trip point is selectively placed somewhere between the un-blown resistance and the minimum blown resistance. Thus, the default is to a known state (blown), thereby, providing the same flexibility as seen with prior art single-sided fuse state detection techniques without having to use a remote reference voltage.

An embodiment of an associated method of the invention for detecting the state of selected fuses uses an apparatus, as described above, to pass offset currents through identical signal and reference legs of a fuse state detection circuit, each leg having a plurality of fuses connected in series between a corresponding current source and a corresponding input to a voltage difference detection device.

Optionally, the first fuses in the signal leg are blown on demand by the fuse programming circuit. This process step is optional (i.e., not required) because differently sized currents are passed through the signal and reference legs during the fuse state detection processes so as to selectively place the trip point somewhere between the un-blown resistance and the minimum blown resistance. Placing the trip point between the un-blown resistance and the minimum blown resistance sets the default to a known state (blown) and, thereby, provides the same flexibility as seen with prior art single-sided fuse state detection techniques. The first fuses in the signal leg are blown by providing a blow voltage (i.e., a supply voltage or voltage source) that is sufficient to cause a current within the programming circuit to become high enough to blow the first fuses and by allowing, through the use of controlled transistors, the blow current to flow sequentially through the first fuses.

To test the state of the fuses, currents are simultaneously passed through the identical signal and reference legs of the fuse state detection circuit. For example, a first current can be passed from a first current source through the first fuses in the signal leg to a first input to the voltage difference detection device. Simultaneously, a second current can be passed from a second current source through the second fuses in the reference leg to a second input to the voltage difference detection device. The first and second current sources can be configured, as discussed above, so that the first current to the signal leg is less than the second current to the reference leg.

Then, a first voltage of the first current after the first current has passed through the first fuses is compared to a second voltage of the second current after second current has passed through the second fuses to make a determination as to whether or not the first fuses have been blown. Because the first current is passed through, not one, but a plurality of first fuses in the signal leg and the second current is passed through, not one, but a plurality of second fuses in the reference leg, the potential difference between the signal leg resistance and the reference leg resistance is significantly increased. Thus, the detectable range for blown fuses is increased proportionate to the number of additional fuses, thereby, providing an even greater detect sensitivity than that seen with both prior art single-side and differential fuse state detection techniques. Also, because the current that is passed through the signal leg is selectively smaller than the current that is passed through the reference leg, the trip point is selectively placed somewhere between the un-blown resistance and the minimum blown resistance. Thus, the default is to a known state (blown), thereby, providing the same flexibility as seen with prior art single-sided fuse state detection techniques without having to use a remote reference voltage. Consequently, a determination can be made that the first fuses are blown, if the first voltage at the first input to the voltage difference detection device on the signal leg side is less than the second voltage by a predetermined value.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
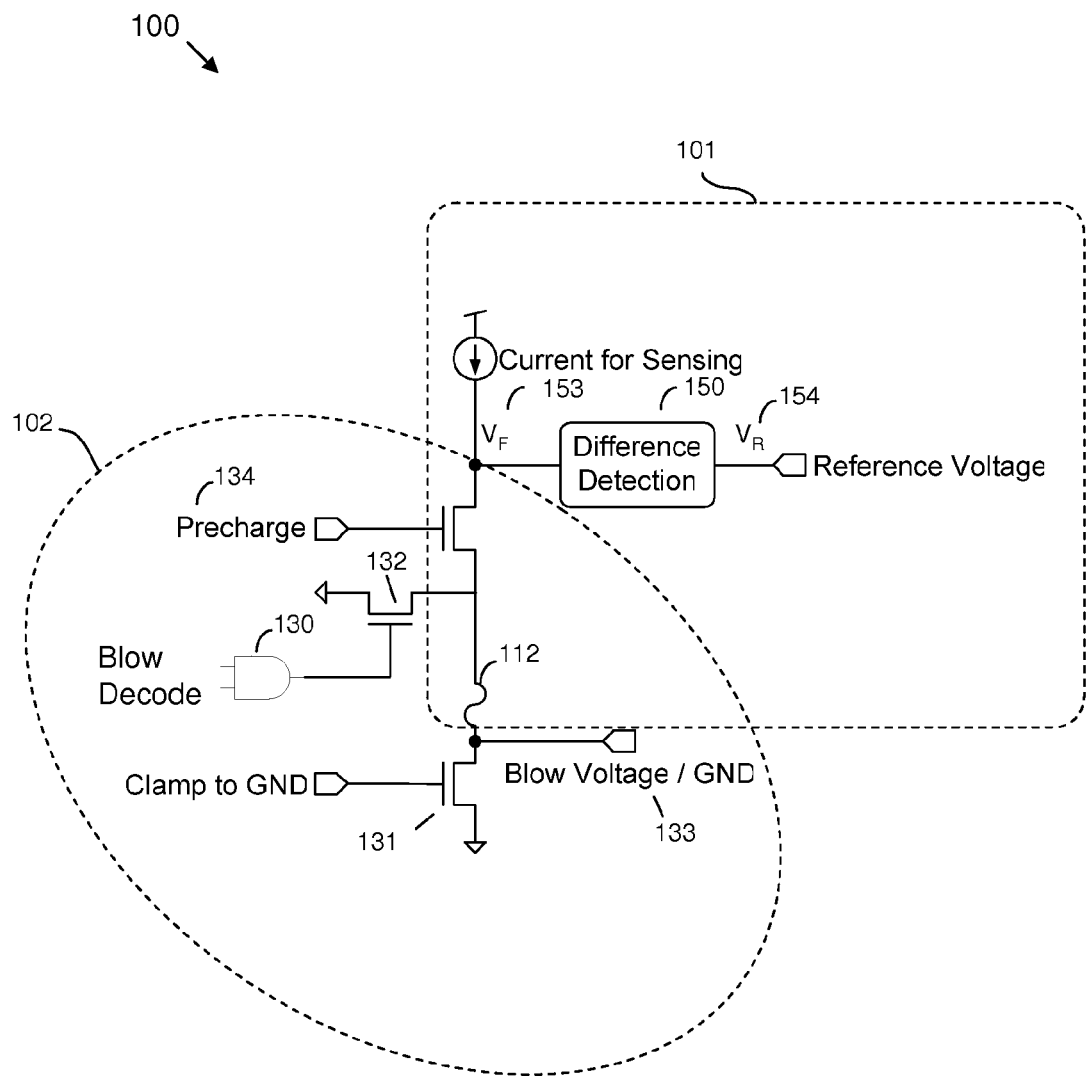
FIG. 1 is a schematic diagram illustrating a single-sided fuse state detection circuit.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, chips that are designed with fuses that can be blown on demand to alter chip performance after fabrication are also designed with fuse state detections circuits for determining whether or not individual fuses have been blown. Various techniques for detecting fuse states are known.

For example, FIG. 1 illustrates an apparatus 100 with a fuse programming circuit 102 combined with a single-sided fuse state detection circuit 101. The single-sided fuse state detection circuit 101 compares the voltage ($V_F$ 153) of a current after it has passed through a fuse 112 to a reference voltage ($V_R$ 154). More specifically, a reference voltage ($V_R$ 154) is generated analogously, remotely, and distributed to one side of a difference detection device 150 (e.g., a sense amp, a differential amp, a comparator, a current detector, etc.). On demand, a blow decode device 130 (i.e., a controller) in the fuse programming circuit 102 initiates blowing of the fuse 112. The clamp to ground n-FET 131 is shut off to avoid a short to ground, the blow decode n-FET 132 (i.e., the blow transistor) is turned on and the blow voltage 133 is increased to a value that would cause a blow current sufficient to blow the fuse 112. The blow current will then flow through the fuse 112 and the blow decode n-FET 132 in order to burn or blow the fuse 112.

To detect whether the fuse 112 did in fact blow, a determination is made as to whether the resistance of the fuse 112 changed from a low value to a high value. This is accomplished by turning on the clamp to ground n-FET 131 and by also turning on the pre-charge 134, which allows a current to pass through the fuse 112 so that a voltage ($V_F$ 153) is generated at the input to the difference detection device 150. This fuse voltage ($V_F$ 153) is compared by the difference detection device 150 to the reference voltage ($V_R$ 154). If the voltage ($V_F$ 153) from the current that has passed through the fuse 112 is higher than the reference voltage ($V_R$ 154), then the resistance of the fuse 112 is high (i.e., the fuse 112 has been blown). If the voltage ($V_F$ 153) from the current that has passed through the fuse 112 is lower than the selected reference voltage ($V_R$ 154), then the resistance of the fuse 112 is low (i.e., the fuse 112 has not been blown).

Figure 2:
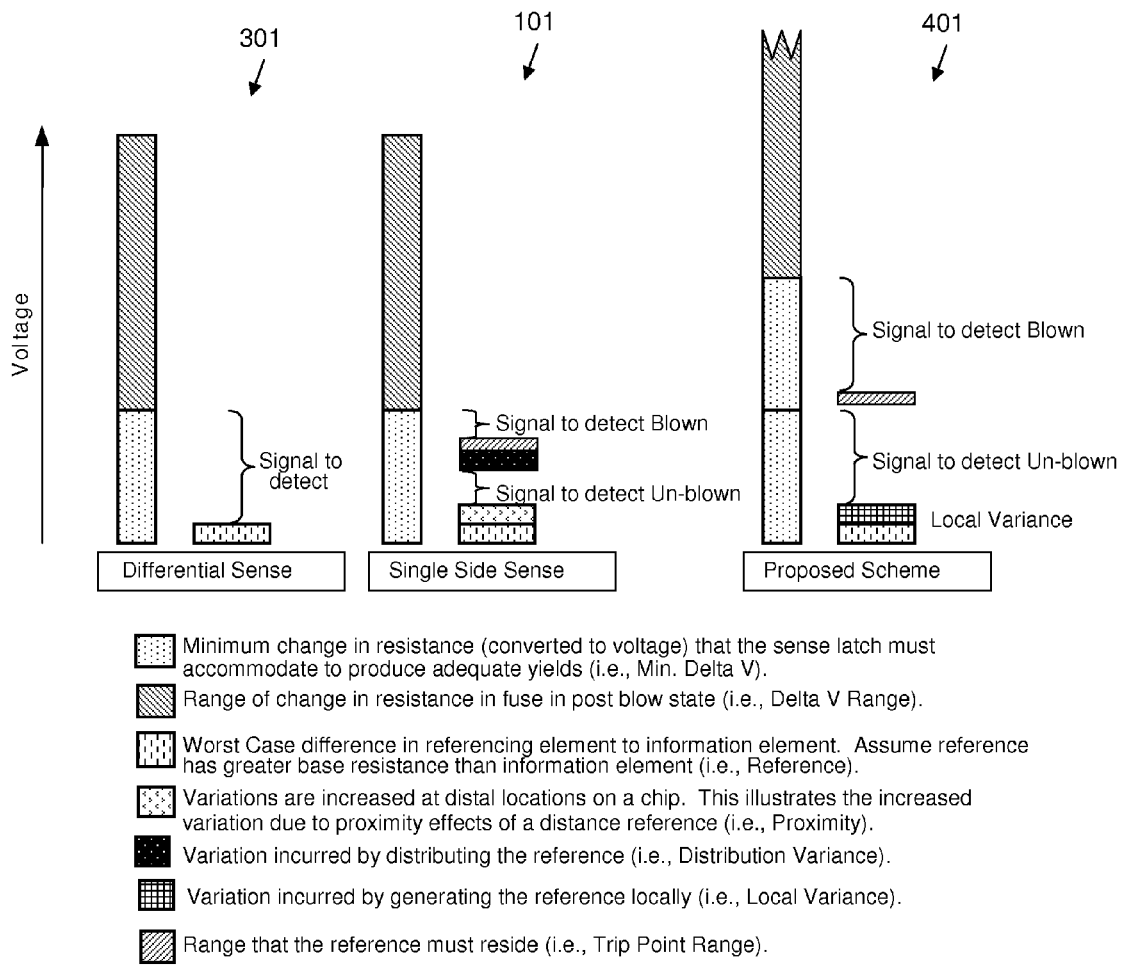
FIG. 2 is a diagram comparing signal tolerances of an embodiment of the fuse state detection circuit of the invention compared to the signal tolerances of single-sided and differential fuse state detection circuits.
Figure 3:
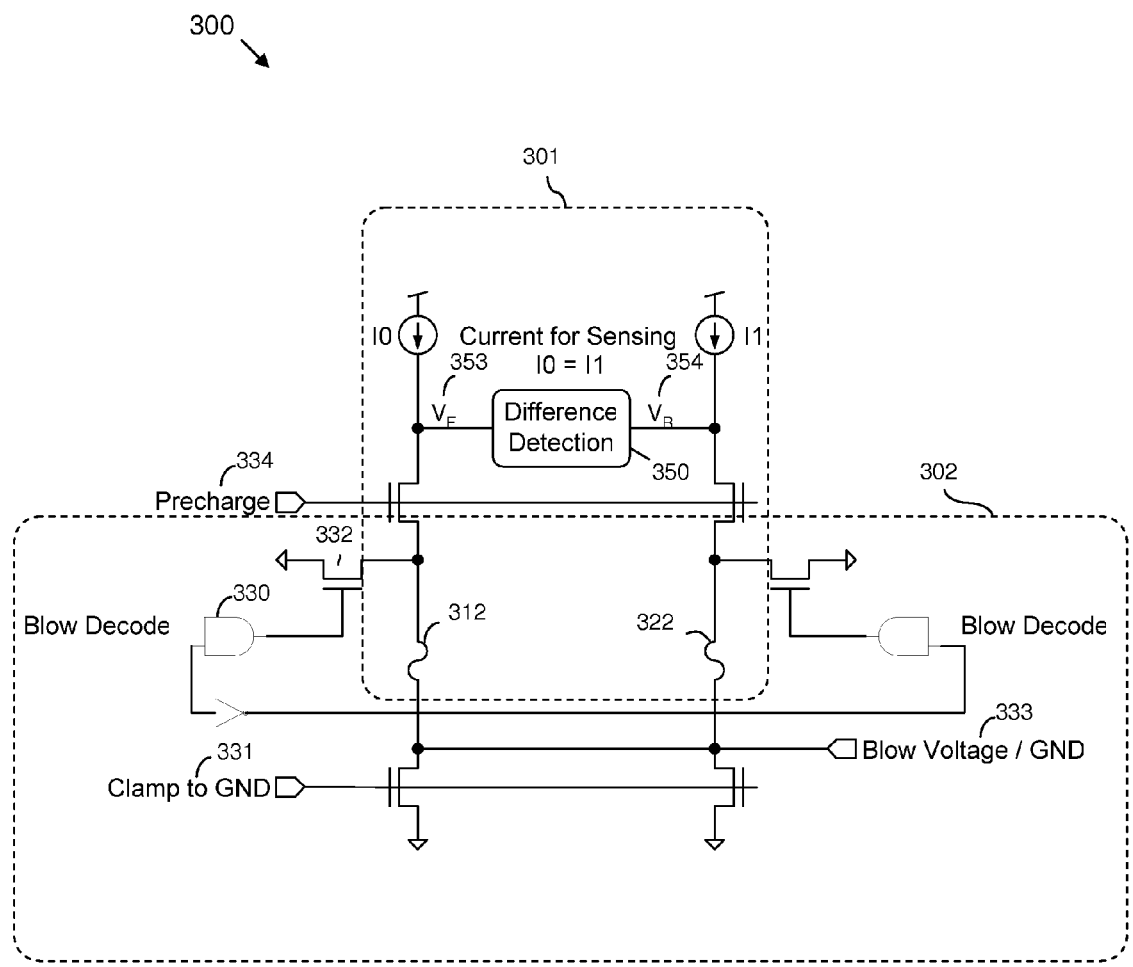
FIG. 3 is a schematic diagram illustrating a differential fuse state detection circuit.

Referring to FIG. 2 in combination with FIG. 1, single-sided circuits 101 have the advantage of defaulting into a known state (blown). Specifically, because the fuse 112 does not have to be blown by fuse programming circuit in order to be tested, the circuit 101 allows for multiple repair options and even field modifiable parts. However, such single-sided circuits 101 are less sensitive to small resistance variations and must endure the ever increasing mismatches that occur with technology scaling. More specifically, when using a single-sided fuse detection circuit 101, the trip point must be placed somewhere between the un-blown resistance and the minimum blown resistance. This immediately reduces the maximum signal swing to detect by at least half of that which could be expected in the differential implementation (FIG. 3). Variations in distributed trip point values also erode the delta resistance to detect. Consequently, because of smaller resistance variations between a blown and un-blown fuse and higher variability in devices, the single-sided fuse state detection circuit 101 may not be sensitive enough to detect a blown fuse.

FIG. 3 illustrates an apparatus 300 with a fuse programming circuit 302 combined with a differential fuse state detection circuit 301. The differential fuse state detection circuit 302 compares the voltage ($V_F$ 353) generated by a current after it has passed through a fuse 312 with the voltage ($V_R$ 354) generated by an equal current after it has passed through an identical un-blown reference fuse 322. Specifically, one side of the detect circuit 301 is biased by one fuse 312 with a complementary fuse 322 on the opposite side of the circuit 301. Thus, the reference voltage ($V_R$ 354) in the differential circuit 301 is generated locally from the reference fuse 322, as opposed to being generated remotely. In this circuit 301 one or the other of the fuses 312 and 322 must be blown, while the other remains un-blown and functions as a reference fuse to produce a valid state. If no fuse is blown, an indeterminate state could lead to large cross currents during the set of a fuse bank. For illustration purposes, the fuse 312 is described as the signal fuse and the fuse 322 is described as the reference fuse. As with the previously described circuit, on demand, a blow decode device 230 (i.e., a controller in the fuse programming circuit 302) initiates blowing of the fuse 312. The clamp to ground n-FET 331 is shut off to avoid a short to ground, the blow decode n-FET 332 is turned on and the blow voltage 333 is turned up to high to cause a blow current sufficient to blow the fuse 312. The blow current will then flow through the fuse 312 and the blow decode n-FET 332 in order to burn or blow the fuse 312.

To detect whether the fuse 312 did in fact blow, a determination is made as to whether the resistance of the fuse 312 changed from a low value to a high value. This is accomplished by turning the clamp to ground n-FET 331 back on and by also turning on the pre-charge 334, which allows an equal current (I0=I1) to pass through both the fuse 312 and the reference fuse 322. Thus, a voltage ($V_F$ 353) is generated at one input to the difference detection device 350 and a reference voltage ($V_R$ 354) is generated at another input to the difference detection device 350. The fuse voltage ($V_F$ 353) is compared by the difference detection device 350 to the reference voltage ($V_R$ 354). If the voltage ($V_F$ 353) of the current that has passed through the fuse 312 is higher than the reference voltage ($V_R$ 354), then the resistance of the fuse 312 is high (i.e., the fuse 312 has been blown). Otherwise, $V_F$ should be equal to $V_R$ because the current passing through the fuses 312, 322 is equal (i.e., I0=I1) and the fuses are identical.

Referring to FIG. 2 in combination with FIG. 1, differential fuse state detection circuits 301 have the advantage of providing greater sensitivity to the detection process. Specifically, by blowing one fuse or the other the full delta resistance can be used (i.e., the voltage swing within which a blown fuse can be detected is doubled) so that the circuit can discriminate even a small resistance variation between a blown and an un-blown fuse. Additionally, with the reference kept local, the circuit 301 is immune to distributed mismatch effects. However, the disadvantage to the differential circuit 301 is that it has an indeterminate default state. Specifically, because one or the other of the fuses 312 or 322 must be blown for a difference to be sensed, the detection circuit 301 precludes the application of the fuse 312 for future or field repairs.

The advantages and disadvantages between the single-sided fuse detection circuit 101 and the differential fuse detection circuit 301 must be balanced when determining which fuse detection circuit to use in an apparatus. Therefore, there is a need in the art for an improved fuse detection circuit that can be combined in an apparatus with a fuse programming circuit and that provides the same or greater advantages with regard to flexibility and sensitivity as both single-sided fuse detection circuits 101 of FIG. 1 and differential fuse detection circuits 301 of FIG. 3.

In view of the foregoing, disclosed herein are embodiments of an apparatus 400 that incorporates both a fuse state detection circuit 401 adapted to determine the state of selected fuses, as blown or un-blown, and a fuse programming circuit 402 adapted to blow selected fuses within the apparatus 400 on demand (see FIG. 3). Also disclosed herein are embodiments of an associated method of detecting the state of selected fuses within such an apparatus (see FIG. 7).

Figure 4:
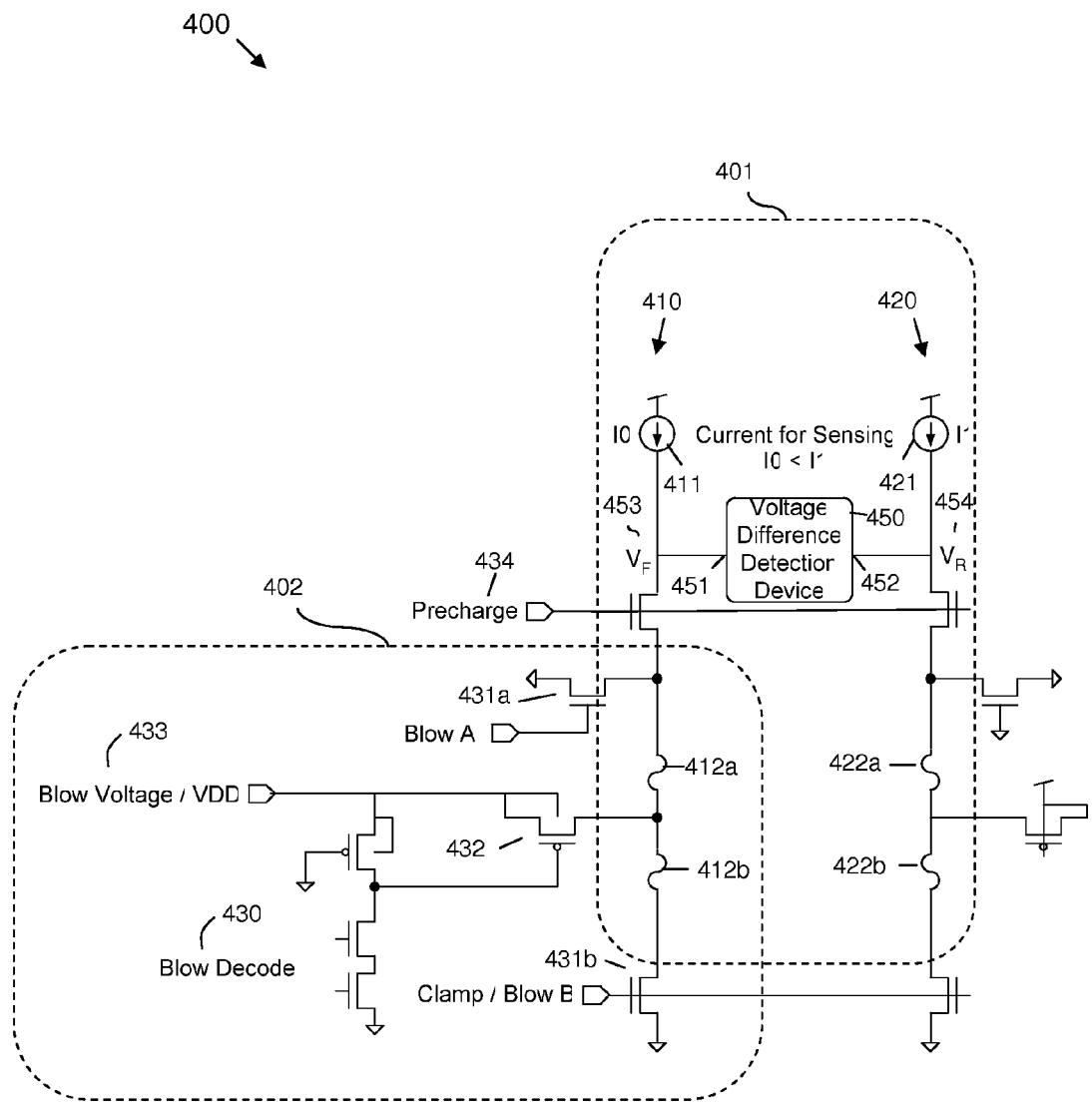
FIG. 4 is a schematic diagram illustrating an embodiment of the invention.

Referring to FIG. 4, the fuse state detection circuit 401 can comprise two current sources 411, 421, a voltage difference detection device 450 with two inputs 451, 452 and identical signal 410 and reference 420 legs. The signal and reference legs 410 and 420 of the circuit 401 are each electrically connected between a corresponding one of the current sources 411, 421 and a corresponding one of the inputs 451, 452 to the voltage difference detection device 450. A plurality of identical fuses 412a-b, 422a-b can be connected in series within each leg 410, 420 to increase the sensitivity of the circuit 401 by increasing the raw signal that can be detected by the voltage difference detection device 450. That is, as illustrated in FIG. 4, by passing currents through a plurality of fuses 412a-b, 422a-b on both the signal and reference legs 410, 420, as opposed to single fuses, the voltage difference between the signal leg 410 with blown fuses 412a-b and the identical reference leg 420 with un-blown fuses 422a-b is increased. Thus, the voltage difference is more likely to be detectable. Additionally, the current sources 411, 421 that are incorporated into the fuse state detection circuit 401 can be differently configured so that the current to each leg 410, 420 is offset (i.e., each leg 410, 420 receives a current having a different size). By providing offset currents to each leg 410, 420, the trip point is selectively placed somewhere between the un-blown resistance and the minimum blown resistance. Consequently, the voltage difference detection device 450 can default to a known state (blown) and the fuses 412a-b in the signal leg 410 do not have to be blown prior to testing, thereby allowing for greater flexibility.

Figure 5:
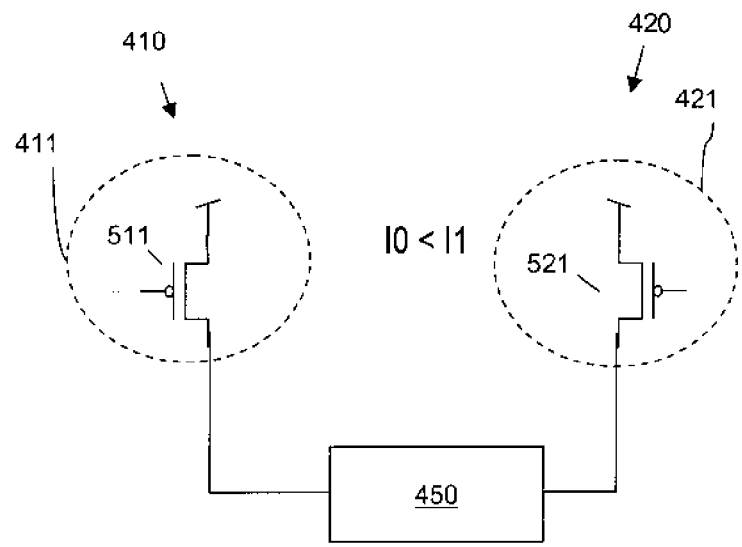
FIG. 5 is a schematic diagram illustrating current sources which may be incorporated into FIG. 3.

More specifically, the current sources of the fuse state detection circuit 401 can comprise a first current source 411 adapted to produce a first current and a second current source 421 adapted to produce a second current. The first and second current sources 411, 421 can be configured so that the first and second currents are offset (i.e., first current<second current) to reduce distributed mismatch. For example, referring to FIG. 5, the current sources 411, 421 can comprise different controlled gate voltages applied to identical p-type field effect transistors (p-FETs) 511 and 521 connected to the signal and reference legs of the circuit. However, using locally offset currents allows for even closer matching.

Consequently, again referring to FIG. 5, the first current source 411 can comprise a first transistor 511 (e.g., a first p-FET)) connected to the signal leg 410 so that it is positioned adjacent to the first fuses. The second current source 421 can similarly comprise a second transistor 521 (e.g., a second p-FET) connected to the reference leg 420 so that it is positioned adjacent to the second fuses. However, instead of using controlled gate voltages to offset the first and second currents, as described above, the currents driven down the legs 410, 420 can be skewed by sizing the source pfets 511, 521 (e.g., the first gate width of the first p-FET 511 can be formed smaller than the second gate width of the second p-FET 521 so that the first current is smaller than the second current). More specifically, since the voltage seen at the voltage difference detection device is relative to $I_{leg}(2*Rfuse)$, skewing the width of the pfet headers 511, 521 will be seen as a direct difference of resistance, allowing for the offset needed for single sided detect. The close proximity of the pfets will allow for close matching.

Figure 6:
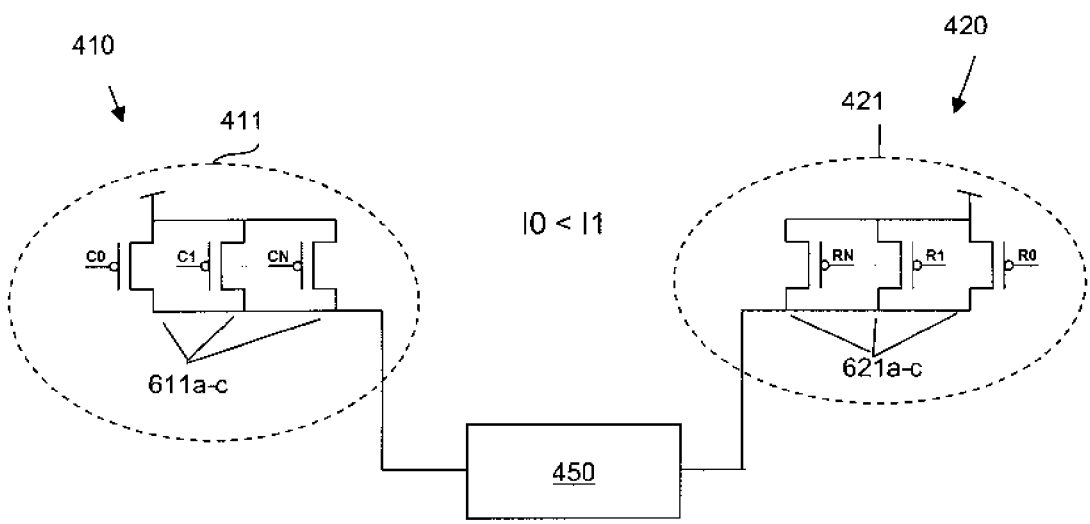
FIG. 6 is a schematic diagram illustrating alternative current sources which may be incorporated into FIG. 3.

Alternatively, referring to FIG. 6, the first current source 411 can comprise a first group of p-FETs 611a-c electrically connected in parallel to the signal leg 410 so that they are positioned adjacent to the first fuses. The second current source 421 can similarly comprise a second group of p-FETs 621a-c electrically connected in parallel to the reference leg 420 so that they are positioned adjacent to the second fuses. Again, the close proximity of the pfets will allow for close matching. However, to provide for the offset, each of the p-FETs 611a-c and 621a-c within each group can be configured so that they are digitally selectable. Thus, an equal current can be applied to both the first and second groups of p-FETs, however, by digitally selecting individual p-FETs within each group, the size of the first and second currents passing to the signal and reference legs 410, 420 can be selectively adjusted (i.e., small pfet fingers can be independently turned on to check the margin of the detect).

Again referring to FIG. 4, the identical signal 410 and reference 420 legs of the fuse detection circuit 401 can each comprise a plurality (e.g., two) of identical fuses (412a-b and 422 a-b) electrically connected in series between a corresponding current source 411, 412 and a corresponding input 451, 452 to the voltage difference detection device 450. Specifically, the signal leg 410 can comprise a plurality of first fuses 412a-b electrically connected in series between the first current source 411 and the first input 451 to the voltage difference detection device 450 so that the first current flows from the first current source 411 through the first fuses 412a-b to the first input 451. The signal leg 410 can also be electrically connected to the fuse programming circuit 402, as discussed in further detail below, so that all of the fuses 412a-b within the signal leg 410 can be blown on demand. The reference leg 420 can similarly comprise a plurality of second fuses 422a-b electrically connected in series between the second current source 421 and the second input 452 to the voltage difference detection device 450 so that the second current flows from the second current source 421 through the second fuses 422a-b to the second input 452.

The voltage difference detection device 450 (e.g., a sense amp, a differential amp, a comparator, a current detector, or any other similar device that can be adapted to detect voltage differences) can be adapted to sense a first voltage $V_F$ 453 generated by the first current at the first input 451 (i.e., after the first current has passed through the first fuses 412a-b) and a second voltage ($V_R$ 454) generated by the second current at the second input 452 (i.e., after the second current has passed through the second fuses 422a-b). The voltage difference detection device 450 can further be adapted to determine a difference between the first voltage 453 and the second voltage 454, which when evaluated (e.g., by a processor) can be used to determine the state of the fuses 412a-b within the signal leg 410. It should be noted that during a fuse state detection process, the fuses 422a-b within the reference leg 420 would remain un-blown.

The fuse programming circuit 402 of the apparatus 400 can comprise a blow voltage 433, a primary blow decode transistor 432, a controller 430, and a plurality of secondary blow transistors 431a-b. The blow voltage 433 is a supply voltage or voltage source that is turned up so that it is sufficient to cause a current (i.e., blow current or third current) that is flowing within the circuit 402 over the first fuses 412a-b to become high enough to blow the first fuses 412a-b. This blow voltage 433 is higher than the supply voltage required for normal chip operation. The primary blow decode transistor 432 (e.g., a p-FET) and the secondary blow transistors 431a-b(e.g., n-FETs) in combination control flow of the blow current through the fuses 412a-b and, thus, control blowing of the first fuses 412a-b. Each fuse 412a-b is electrically connected between the primary blow decode transistor 432 and a corresponding secondary blow transistor 431a-b. A controller 430 (i.e., a blow decode device) is used to initiate on demand sequential blowing of the first fuses by turning on the primary blow decode transistor, allowing the blow current to flow through the circuit. Each of the secondary blow transistors 431a-b (e.g., n-FETs) will control the flow of this blow current through the corresponding first fuses 412a-b and also function as n-FET clamps to ground in order to avoid shorts to ground.

Additionally, the secondary transistors 431a-b can be configured with increased potential (e.g., configured so that their gate voltage is approximately equal to the blow voltage 433). They can also be remotely controlled. By increasing the potential on the gates of the secondary transistors 431a-b above the normal chip operating voltage and by controlling these transistors 431a-b remotely, their size can be minimized (i.e., substantially reduced). That is, since the local blow select is decoded by the pfet 432, the nfet 431a-b gate controls can be remote allowing for level shifted gates, which substantially reduces the size of the nfet blow devices 431a-b. This is important because the overall size of the cell is dominated by the blow fet size, and not the fuse elements.

As mentioned above, the voltage difference detection device 450 compares the first voltage 453 of the first current at the first input 451 to the second voltage 454 (a reference voltage) of the second current at the second input 454. A detectable difference between the signal and reference leg voltages 453 and 454 represents a difference in resistance in these legs as a result of blown fuses 412a-b. Specifically, if all of the first fuses 412a-b are blown and all of the second fuses 422a-b remained intact, then the resistance of the signal leg 410 will be greater than that of the reference leg 420 and this greater resistance will be evidenced by a detectable difference between the first and second voltages 453, 454. Therefore, the first and second voltages 453, 454 are compared by the device 450 to make a determination as to whether or not the first fuses 412a-b have been blown.

The diagram of FIG. 2, which compares the signal tolerance of the fuse state detection circuits 401 of FIG. 4, 301 of FIG. 3 and 101 of FIG. 1, illustrates several advantages of the apparatus 400 over the prior art. Specifically, since the first current is passed through, not one, but a plurality of first fuses in the signal leg 410 and the second current is passed through, not one, but a plurality of second fuses in the reference leg 420, the potential difference between the signal leg resistance and the reference leg resistance is significantly increased. That is, the resistance change that can be achieved by blowing the fuses in the signal leg and thus, the range for detecting blown fuses, is increased proportionate to the number of additional fuses (e.g., it is double by adding an extra fuse). Doubling the resistance change provides an even greater detect sensitivity than that seen with both prior art single-side and differential fuse state detection techniques. This is increasingly more important when the blow fuse distributions show random flyers with low resistances. The fuse detect design must accommodate the flyers. While the probability of encountering a "flyer" remains the same per fuse, the chances of it affecting the fuse sense are significantly reduced. Additionally, since the current that is passed through the signal leg 410 is selectively smaller than the current that is passed through the reference leg 420, the trip point is selectively placed somewhere between the un-blown resistance and the minimum blown resistance. Thus, the default is to a known state (blown), thereby, providing the same flexibility as seen with prior art single-sided fuse state detection techniques without having to use a remote reference voltage.

Therefore, the embodiment of the apparatus 400 of the invention, described above, incorporates a fuse state detection device 401 that comprises a plurality of fuses 412a-b in identical signal 410 and reference 420 legs and also comprises differently configured local current sources 411, 421 connected to each of these legs 410, 420. This embodiment offers the flexibility of prior art single-sided fuse state detection devices (e.g., see circuit 101 of FIG. 1) with even greater sensitivity than both prior single-sided and differential fuse state detection device (see circuits 101 and 301 of FIGS. 1 and 3, respectively). Another advantage of the apparatus 400 is the increased (doubled) apparent fuse base resistance. This reduces (halves) the amount of sense current required to develop signal at the sense device, which, in turn, lowers the overall operating current by roughly half. Furthermore, since in the signal paths are driven by reduced currents, the set sense amp has much more "set margin" for the same size sense amp devices.

Other embodiments of the apparatus 400 of the invention are also anticipated. For example, another embodiment of the apparatus 400 can comprise current sources 411, 412 configured to pass offset currents through signal and reference legs 410, 420 having only one fuse. This, embodiment would provide the sensitivity of prior art differential fuse state detection circuits as well as the flexibility of single-side fuse state detection techniques. Alternatively, yet another embodiment of the apparatus 400 can comprise current sources 411, 412 configured to pass equal currents through identical signal and reference legs 4120, 420, each of which have a plurality of fuses 412a-b, 422a-b electrically connected in series. This embodiment, while not providing the flexibility of prior art single-sided fuse state detection techniques, would provide greater sensitivity over both prior art single-sided and differential fuse state detection techniques.

Figure 7:
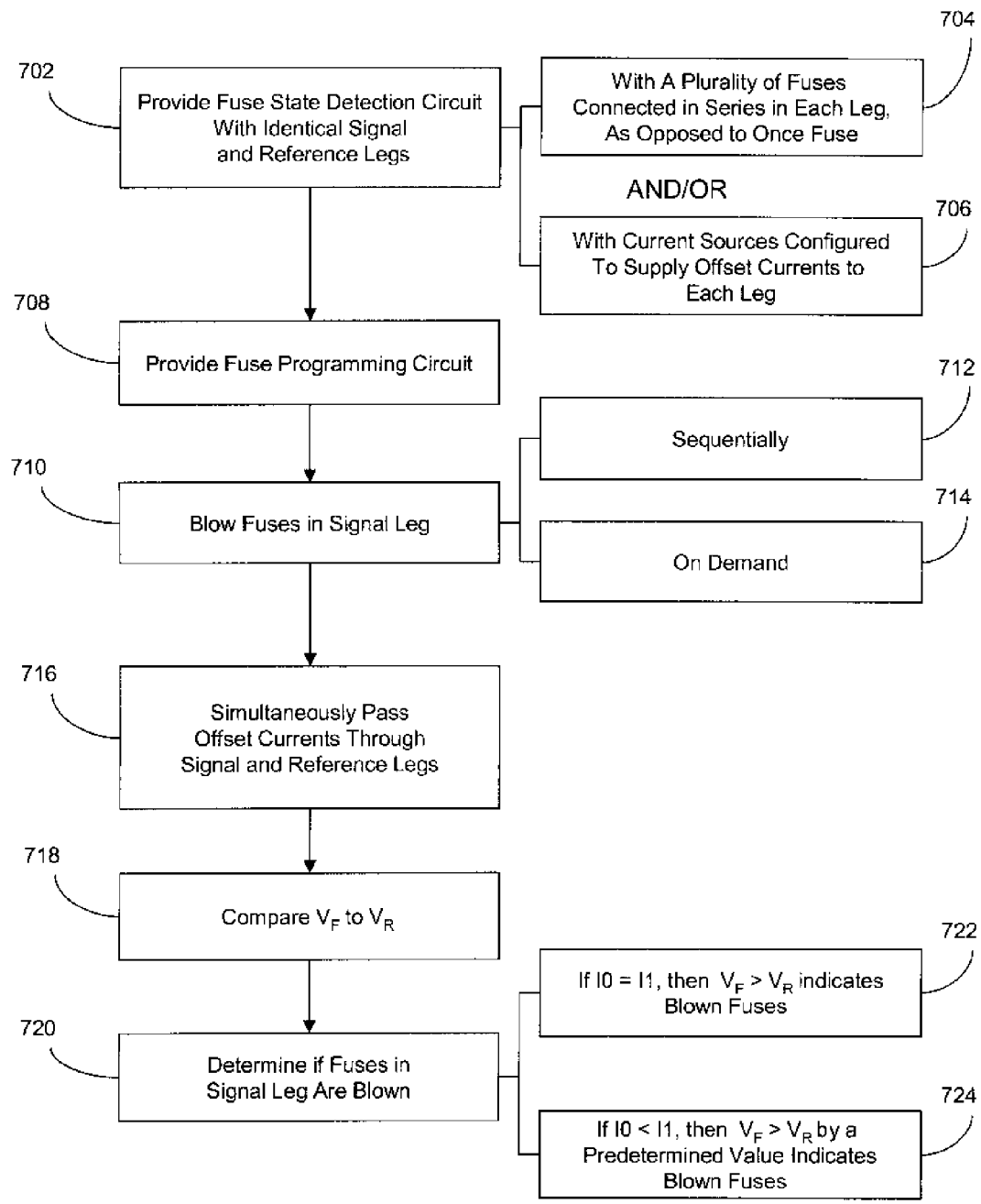
FIG. 7 is a flow diagram illustrating an embodiment of the method of the invention.

Referring to FIG. 7 in combination with FIG. 4, an embodiment of an associated method of the invention for detecting the state of selected fuses (i.e., blown or un-blown) uses an apparatus 400, as described above, to pass offset currents (i.e., separate currents with different sizes) through identical signal and reference legs 410, 420 of a fuse state detection circuit 401, each having a plurality of fuses 412a-b connected in series between a corresponding current source 511 and a corresponding input 451 to a voltage difference detection device 450.

Specifically, the method comprises providing the apparatus 400, as described above and illustrated in FIG. 4, which combines a fuse programming circuit 402 (702) and a fuse state detection circuit 401 (708). The fuse state detection circuit 401 can comprise identical signal and references legs 410, 420 connected between corresponding current sources 411, 421 and corresponding inputs 451, 452 of a voltage difference detection device 450. Each of the legs 410, 420 can comprises a plurality of fuses 412*a-b*, 422*a-b* connected in series within each leg 410, 420 (704) and/or each of the current sources 411, 421 can be configured to supply offset currents to each of the legs 410, 420 (706)

Optionally, the first fuses 412*a-b* in the signal leg 410 are blown (710) on demand (714) by the fuse programming circuit. This process step is optional (i.e., not required) if differently sized currents are passed through the signal and reference legs 410, 420 during the fuse state detection processes (716-726, described below) so as to selectively place the trip point somewhere between the un-blown resistance and the minimum blown resistance. Placing the trip point between un-blown resistance and minimum blown resistance, sets the default to a known state (blown) and, thereby, provides the same flexibility as seen with prior art single-sided fuse state detection techniques. The first fuses 412*a-b* in the signal leg 410 are blown by providing a blow voltage 433 (i.e., a voltage source or voltage source) that is sufficient to cause a current (i.e., a blow current or third current) within the programming circuit 402 to become high enough to blow the first fuses 412*a-b* and by allowing, through the use of controlled transistors 432, 431*a-b*, the blow current to flow sequentially through the first fuses (712). The second fuses 422*a-b* not blown.

To test the state of the fuses 412*a-b* (e.g., to confirm whether the first fuses in the signal leg have been blown or to confirm whether they remain un-blown), currents are simultaneously passed through the identical signal and reference legs of the fuse state detection circuit (716). For example, a first current can be passed from a first current source 411 through the first fuses 412*a-b* in the signal leg 410 to a first input 451 to the voltage difference detection device 450. Simultaneously, a second current can be passed from a second current source 421 through the second fuses 422*a-b* in the reference leg 420 to a second input 452 to the voltage difference detection device 450. The first and second current sources 411, 421 can be configured, as discussed above, so that the first current flowing to the signal leg 410 is less than the second current flowing to the reference leg 420.

Then, a first voltage 453 of the first current after the first current has passed through the first fuses 412*a-b* (e.g., at the first input 451 to the voltage difference detection device 450) compared to a second voltage 452 of the second current after second current has passed through the second fuses 422*a-b* (e.g., at the second input 454 to the voltage difference detection device) (716). Any noted differences are evaluated in order to make a determination as to whether or not the first fuses have been blown (718).

Specifically, the voltage difference detection device 450 notes detectable differences between the voltages 453, 454 of the signal and reference legs 410, 420. These differences represent resistance differences between the legs, which indicate blown fuses. For example, if all of the first fuses are blown and all of the second fuses remained intact, then the resistance of the signal leg will be greater than that of the reference leg and this greater resistance will be evidenced by a detectable difference between the first and second voltages. Since the first current is passed through, not one, but a plurality of first fuses in the signal leg and the second current is passed through, not one, but a plurality of second fuses in the reference leg, the potential difference between the signal leg resistance and the reference leg resistance is significantly increased. That is, the resistance change that can be achieved by blowing the fuses in the signal leg and thus, the range for detecting blown fuses, is increased proportionate to the number of additional fuses (e.g., it is double by adding an extra fuse). Doubling the resistance change provides an even greater detect sensitivity than that seen with both prior art single-side and differential fuse state detection techniques. Additionally, since the current that is passed through the signal leg is selectively smaller than the current that is passed through the reference leg, the trip point is selectively placed somewhere between the un-blown resistance and the minimum blown resistance. Thus, the default is to a known state (blown), thereby, providing the same flexibility as seen with prior art single-sided fuse state detection techniques without having to use a remote reference voltage. Consequently, a determination can be made that the first fuses are blown, if the first voltage at the first input to the voltage difference detection device on the signal leg side is higher than the second voltage by a predetermined value (724).

The embodiment of the method, described above, passes offset currents through identical signal and reference legs of a fuse state detection circuit, where each of the legs comprise a plurality of fuses connected in series. By incorporating both of these features into the method, the method increases allows for both the flexibility of single-sided fuse state detection techniques and greater sensitivity than differential fuse state detection techniques.

Other embodiments that incorporate these features in the alternative are also anticipated. For example, another embodiment of the method can comprise passing offset currents through signal and reference legs having only one fuse (see processes 702-706). With this embodiment the fuse may, optionally, be blown first (i.e., process 710 is optional). Additionally, with this embodiment, a determination can be made that the fuses in the signal leg are blown, if the first voltage at the first input to the voltage difference detection device on the signal leg side is higher than the second voltage by a predetermined value (722). Consequently, this embodiment would provide the sensitivity of prior art differential fuse state detection techniques as well as the flexibility of single-side fuse state detection techniques.

Alternatively, yet another embodiment of the method can comprise passing equal currents through identical signal and reference legs, each of which have a plurality of fuses electrically connected in series (see processes 702-706). With this embodiment, fuses in the signal leg must be blown first (i.e., process 710 is not optional). Additionally, with this embodiment a determination can be made that the fuses are blown in this embodiment, if the first voltage at the first input to the voltage difference detection device on the signal leg side is higher than the second voltage. Consequently, this embodiment, while not providing the flexibility of prior art single-sided fuse state detection techniques, would provide greater sensitivity over both prior art single-sided and differential fuse state detection techniques.

Therefore, disclosed above, are embodiments of an apparatus that incorporates both a fuse state detection circuit adapted to determine the state of selected fuses, as blown or un-blown, and a fuse programming circuit adapted to blow selected fuses within the apparatus on demand. Also, disclosed are embodiments of an associated method of detecting the state of selected fuses within such an apparatus. The fuse state detection circuit comprises a plurality of fuses in identical signal and reference legs to increase the signal margin for detecting blown fuses and/or current sources configured to pass offset currents through the signal and reference legs in order to set the trip point for detecting blown fuses between the un-blown and the minimum blown resistances. Consequently, the apparatus provides the flexibility of single-sided fuse state detection with even greater sensitivity and, when compared to current differential circuits, the apparatus increases the detect sensitivity, lowers the set power, increases the product yield, and provides greater tolerance to process windows. Furthermore, the fuse programming circuit of the apparatus can be configured to provide sequential blowing of the fuses in the signal leg on demand using a locally controlled p-FET and a plurality of remotely controlled n-FETs with increased potential. By increasing the n-FET gate potential and by controlling these transistors remotely, their size can be minimized. Thus, the apparatus can have a similar, if not smaller footprint, than a conventional differential fuse state detection circuit.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention can be practiced with modification within the spirit and scope of the appended claims.

What is claimed is:

1. An apparatus comprising:
    a first current source adapted to produce a first current;
    a second current source adapted to produce a second current;
    a difference detection device with a first input electrically connected to said first current source and with a second input electrically connected to said second current source;
    a plurality of first fuses that are electrically connected in series, wherein said plurality of first fuses are electrically connected to said first current source such that said first current flows from said first current source to said first input and also through said first fuses; and
    a plurality of second fuses that are electrically connected in series, wherein said plurality of second fuses are electrically connected to said second current source such that said second current flows from said second current source to said first input and also through said second fuses,
    wherein said first fuses and said second fuses all comprise identical fuses, and
    wherein said difference detection device is adapted to sense a first voltage at said first input, to sense a second voltage at said second input and to compare said first voltage to said second voltage in order to determine if said first fuses have been blown.

2. The apparatus of claim 1, further comprising a blow voltage that is sufficient to cause a third current passing over said first fuses to become high enough to blow said first fuses.

3. The apparatus of claim 2, further comprising a primary transistor and a plurality of secondary transistors, wherein said primary transistor is electrically connected between said blow voltage and each of said first fuses, wherein said secondary transistors are each connected between a corresponding one of said first fuses and ground and wherein said primary transistor and said secondary transistors are configured to control flow of said third current through said first fuses.

4. The apparatus of claim 3, further comprising a controller configured to initiate sequential blowing of said first fuses on demand by turning on said primary transistor.

5. The apparatus of claim 3, wherein said secondary transistors are remotely controllable and a gate voltage of said secondary transistors is approximately equal to said blow voltage so that a size of said secondary transistors can be minimized.

6. The apparatus of claim 1, wherein said second fuses are un-blown when said first voltage is compared to said second voltage.

7. The apparatus of claim 1, wherein said first current source and said second current source are configured so that said first current is one of equal to and less than said second current.

8. A method of detecting the state of fuses as blown or un-blown, said method comprising:
    passing a first current from a first current source through a plurality of first fuses that are electrically connected in series and also to a first input of a voltage difference detection device;
    passing a second current from a second current source through a plurality of second fuses that are electrically connected in series and also to a second input of said voltage difference detection device,
        wherein said first fuses and said second fuses all comprise identical fuses and wherein said second fuses are not blown; and
    comparing, by said voltage difference detection device, a first voltage at said first input to a second voltage at said second input to determine whether said first fuses are blown.

9. The method of claim 8, wherein by said passing of said first current through said plurality of first fuses as opposed to one first fuse and said passing of said second current through said plurality of second fuses as opposed to one second fuse, said method proportionately increases a voltage difference that will be detectable if said first fuses are blown.

10. The method of claim 9, further comprising blowing said first fuses on demand by providing a blow voltage sufficient to cause a third current passing over said first fuses to become high enough to blow said first fuses and by allowing said blow current to flow through each of said first fuses sequentially.

11. The method of claim 9, wherein said first current is equal to said second current and wherein said first fuses are determined to be blown if said first voltage is higher than said second voltage.

12. The method of claim 9, wherein said first current is less than said second current and wherein said first fuses are determined to be blown if said first voltage is higher than said second voltage by a predetermined value.

13. A method of detecting the state of fuses as blown or un-blown, said method comprising:
    passing a first current from a first current source through at least one first fuse and also to a first input of a voltage difference detection device;
    passing a second current from a second current source different from said first current source through at least one second fuse and also to a second input of said voltage difference detection device, wherein said at least one first fuse and said at least one second fuse all comprise identical fuses, wherein said at least one second fuse is not blown, wherein said first current source comprises a first p-type field effect transistor having a first gate width and said second current source comprises a second p-type field effect transistor having a second width, and wherein said first gate width is less than said second gate width so that said first current is less than said second current; and comparing a first voltage at said first input to a second voltage at said second input to determine whether said at least one first fuse is blown, wherein said at least one first fuse comprises a plurality of first fuses and said at least one second fuse comprises a plurality of same number second fuses and wherein by passing of said first current through said first fuses as opposed to one first fuse and by passing of said second current through said second fuses as opposed to one second fuse, said method proportionately increases a voltage difference that will be detectable.

14. The method of claim 13, further comprising blowing said at least one first fuse on demand by providing a blow voltage sufficient to cause a third current passing through said at least one first fuse to become high enough to blow said at least one first fuse and by allowing said third current to flow through said at least one first fuse.

15. The method of claim 13, wherein said at least one first fuse is determined to be blown if said first voltage is higher than said second voltage by a predetermined value.

16. A method of detecting the state of fuses as blown or un-blown, said method comprising:

passing a first current from a first current source through at least one first fuse and also to a first input of a voltage difference detection device;

passing a second current from a second current source different from said first current source through at least one second fuse and also to a second input of said voltage difference detection device, wherein said at least one first fuse and said at least one second fuse all comprise identical fuses, wherein said at least one second fuse is not blown, wherein said first current source comprises a first p-type field effect transistor having a first gate width and said second current source comprises a second p-type field effect transistor having a second width, and wherein said first gate width is less than said second gate width so that said first current is less than said second current; and comparing a first voltage at said first input to a second voltage at said second input to determine whether said at least one first fuse is blown, and wherein said at least one first fuse comprises a plurality of first fuses and wherein said method further comprises blowing said first fuses on demand by providing a blow voltage sufficient to cause a third current passing over said first fuses to become high enough to blow said first fuses and by allowing said third current to flow through each of said first fuses sequentially.

* * * * *